(12) United States Patent
Nielsen

(10) Patent No.: US 11,909,400 B2
(45) Date of Patent: Feb. 20, 2024

(54) USE OF STABLE TUNABLE ACTIVE FEEDBACK ANALOG FILTERS IN FREQUENCY SYNTHESIS

(71) Applicant: Anlotek Limited, London (GB)

(72) Inventor: Jorgen Staal Nielsen, Calgary (CA)

(73) Assignee: Anlotek Limited, London (GB)

( * ) Notice: Subject to any disclaimer, the term of this patent is extended or adjusted under 35 U.S.C. 154(b) by 0 days.

(21) Appl. No.: 17/782,103

(22) PCT Filed: Dec. 4, 2020

(86) PCT No.: PCT/IB2020/061547
§ 371 (c)(1),
(2) Date: Jun. 2, 2022

(87) PCT Pub. No.: WO2021/111416
PCT Pub. Date: Jun. 10, 2021

(65) Prior Publication Data
US 2023/0006662 A1    Jan. 5, 2023

Related U.S. Application Data

(60) Provisional application No. 62/944,360, filed on Dec. 5, 2019.

(51) Int. Cl.
*H03H 7/01* (2006.01)
*H03K 5/1252* (2006.01)
*H03H 7/12* (2006.01)

(52) U.S. Cl.
CPC ......... *H03K 5/1252* (2013.01); *H03H 7/0161* (2013.01); *H03H 7/12* (2013.01)

(58) Field of Classification Search
CPC ............... H03K 5/1252; G06F 1/0321; H03H 2007/013; H03H 7/0161; H03H 7/0169; H03H 7/12
See application file for complete search history.

(56) References Cited

U.S. PATENT DOCUMENTS

| 1,570,771 A | 1/1926 | Nyquist |
| 1,778,085 A | 10/1930 | Nyquist |

(Continued)

FOREIGN PATENT DOCUMENTS

| CN | 102098018 A | 6/2011 |
| CN | 104538714 A | 4/2015 |

(Continued)

OTHER PUBLICATIONS

International Search Report dated Mar. 16, 2021, issued in corresponding International Application PCT/IB2020/061547, filed Dec. 4, 2020, 3 pages.

(Continued)

*Primary Examiner* — Jung Kim
(74) *Attorney, Agent, or Firm* — CHRISTSEN O'CONNOR JOHNSON KINDNESS PLLC

(57) ABSTRACT

A method and apparatus for generating an RF signal uses digital signal components to generate a synthesized RF signal having a plurality of frequency components. An analog filter is used to filter the synthesized RF signal. The analog filter is a tunable, active feedback circuit having one or more variable resonators and a variable gain block connected in a signal loop that is defined by a passband. The analog filter is tuned such that the passband of the analog filter overlaps one or more desired frequency components of the plurality of frequency components of the synthesized RF signal, and such that the passband has a relative bandwidth of about 1% or less.

15 Claims, 7 Drawing Sheets

(56) References Cited

U.S. PATENT DOCUMENTS

| | | |
|---|---|---|
| 1,915,440 A | 6/1933 | Nyquist |
| 1,926,169 A | 9/1933 | Nyquist |
| 2,099,769 A | 11/1937 | Nyquist |
| 3,720,881 A | 3/1973 | Hurtig, III |
| 5,220,686 A | 6/1993 | Kasperkovitz et al. |
| 5,291,159 A | 3/1994 | Vale |
| 5,311,198 A | 5/1994 | Sutton |
| 5,854,593 A | 12/1998 | Dykema et al. |
| 5,917,387 A | 6/1999 | Rice et al. |
| 5,949,290 A | 9/1999 | Bertram |
| 6,057,735 A | 5/2000 | Cloutier |
| 6,236,281 B1 | 5/2001 | Nguyen et al. |
| 6,420,913 B1 | 7/2002 | Freeman |
| 6,452,465 B1 | 9/2002 | Brown et al. |
| 6,496,075 B2 | 12/2002 | Justice et al. |
| 6,587,007 B2 | 7/2003 | Exeter |
| 6,650,195 B1 | 11/2003 | Brunn et al. |
| 6,771,147 B2 | 8/2004 | Mongia |
| 6,865,387 B2 | 3/2005 | Bucknell et al. |
| 6,898,450 B2 | 5/2005 | Eden et al. |
| 6,920,315 B1 | 7/2005 | Wilcox et al. |
| 6,937,877 B2 | 8/2005 | Davenport |
| 6,941,118 B2 | 9/2005 | Yamamoto |
| 6,954,774 B1 | 10/2005 | Mulbrook |
| 7,098,751 B1 | 8/2006 | Wong |
| 7,151,925 B2 | 12/2006 | Ting et al. |
| 7,158,010 B2 | 1/2007 | Fischer et al. |
| 7,174,147 B2 | 2/2007 | Toncich et al. |
| 7,346,330 B2 | 3/2008 | Kawabe et al. |
| 7,400,203 B2 | 7/2008 | Ojo et al. |
| 7,414,779 B2 | 8/2008 | Huber et al. |
| 7,423,502 B2 | 9/2008 | Razafimandimby et al. |
| 7,433,668 B2 | 10/2008 | Fischer et al. |
| 7,509,141 B1 | 3/2009 | Koenck et al. |
| 7,522,016 B2 | 4/2009 | Toncich et al. |
| 7,809,410 B2 | 10/2010 | Palum et al. |
| 7,917,117 B2 | 3/2011 | Zafonte |
| 7,937,076 B2 | 5/2011 | Zeller et al. |
| 8,000,379 B2 | 8/2011 | Kishigami et al. |
| 8,050,708 B2 | 11/2011 | March et al. |
| 8,103,213 B2 | 1/2012 | Tolonen |
| 8,106,727 B2 | 1/2012 | Kawai et al. |
| 8,107,939 B2 | 1/2012 | Hassan et al. |
| 8,120,536 B2 | 2/2012 | Lindmark |
| 8,140,033 B2 | 3/2012 | Chan Wai Po et al. |
| 8,253,514 B2 | 8/2012 | Kharrat et al. |
| 8,294,537 B2 | 10/2012 | Kawai et al. |
| 8,565,671 B2 | 10/2013 | Robert et al. |
| 8,767,871 B2 | 7/2014 | Park et al. |
| 8,922,294 B2 | 12/2014 | Tsuzuki et al. |
| 8,981,875 B2 | 5/2015 | Park |
| 9,024,709 B2 | 5/2015 | Joshi et al. |
| 9,083,351 B1 | 7/2015 | Lee et al. |
| 9,129,080 B2 | 9/2015 | Tsuzuki et al. |
| 9,184,498 B2 | 11/2015 | Schiller |
| 9,231,712 B2 | 1/2016 | Hahn et al. |
| 9,407,239 B2 | 8/2016 | White et al. |
| 9,634,390 B2 | 4/2017 | Onaka |
| 9,641,138 B2 | 5/2017 | Zhu |
| 9,698,747 B2 | 7/2017 | Ishizuka |
| 10,050,604 B2 * | 8/2018 | Nielsen ............... H03G 3/3042 |
| 10,228,927 B2 | 3/2019 | Choi et al. |
| 10,236,899 B1 | 3/2019 | Tope et al. |
| 10,396,807 B1 | 8/2019 | Dai et al. |
| 11,290,084 B2 | 3/2022 | Nielsen et al. |
| 2001/0043116 A1 | 11/2001 | Waltman |
| 2004/0030108 A1 | 2/2004 | Pihlava et al. |
| 2005/0003785 A1 | 1/2005 | Jackson et al. |
| 2007/0010217 A1 | 1/2007 | Takahashi et al. |
| 2007/0195915 A1 | 8/2007 | Ko et al. |
| 2007/0296513 A1 | 12/2007 | Ruile et al. |
| 2009/0322445 A1 | 12/2009 | Raidl et al. |
| 2010/0097152 A1 | 4/2010 | Wang et al. |
| 2010/0141355 A1 | 6/2010 | Kharrat et al. |
| 2011/0002080 A1 | 1/2011 | Ranta |
| 2011/0187448 A1 | 8/2011 | Koechlin |
| 2013/0065542 A1 | 3/2013 | Proudkii |
| 2013/0142089 A1 | 6/2013 | Azarnaminy et al. |
| 2013/0293291 A1 | 11/2013 | Shanan |
| 2014/0266454 A1 | 9/2014 | Testi et al. |
| 2014/0361839 A1 | 12/2014 | Scott et al. |
| 2016/0072442 A1 | 3/2016 | Testi et al. |
| 2016/0164481 A1 | 6/2016 | Madan et al. |
| 2017/0149411 A1 | 5/2017 | Nielsen et al. |
| 2020/0014382 A1 | 1/2020 | Ranta |
| 2021/0067125 A1 | 3/2021 | Nielsen |

FOREIGN PATENT DOCUMENTS

| | | |
|---|---|---|
| CN | 108463949 B | 7/2022 |
| EP | 1675263 A1 | 6/2006 |
| EP | 3062442 A1 | 8/2016 |
| GB | 2 403 086 A | 12/2004 |
| GB | 2 478 585 A | 9/2011 |
| GB | 2 494 652 A | 3/2013 |
| WO | 01/89081 A2 | 11/2001 |
| WO | 02/087071 A2 | 10/2002 |
| WO | 2009114123 A2 | 9/2009 |
| WO | 2011/103108 A1 | 8/2011 |
| WO | 2015/176041 A1 | 11/2015 |

OTHER PUBLICATIONS

International Preliminary Report on Patentability dated Jun. 7, 2022, issued in corresponding International Application PCT/IB2020/061547, filed Dec. 4, 2020, 7 pages.

Anis, M., et al., "Fully Integrated Super-Regenerative Bandpass Filters for 3.1-to-7GHz Multiband UWB System," Proceedings of the IEEE International Symposium on VLSI Design, Automation and Test (VLSI-DAT), Apr. 23-25, 2008, Hsinchu, Taiwan, 4 pages.

Anis, M., et al., "Low Power Complementary-Colpitts Self-Quenched Super-Regenerative Ultra-Wideband (UWB) Bandpass Filter in CMOS Technology," Proceedings of the IEEE MTT-S International Microwave Symposium Digest, Jun. 15-20, 2008, Atlanta, pp. 1047-1049.

Bahl, I.J., "High-Performance Inductors," IEEE Transactions on Microwave Theory and Techniques 49(4):654-664, Apr. 2001.

Bhattacharya, A., et al., "A 1.3-2.4-GHz 3.1-mW VCO Using Electro-Thermo-Mechanically Tunable Self-Assembled MEMS Inductor on HR Substrate," IEEE Transactions on Microwave Theory and Techniques 63(2):459-469, Feb. 2015.

Chen, J.-Y., et al., "A Fully Integrated Auto-Calibrated Super-Regenerative Receiver in 0.13-μm CMOS," IEEE Journal of Solid-State Circuits 42(9):1976-1985, Sep. 2007.

Chen, Y.-M., et al., "A 1-1.5 GHZ Broadband Tunable Bandpass Filter," Proceedings of the Asia-Pacific Microwave Conference (APMC), Kaohsiung, Taiwan, Dec. 4-7, 2012, pp. 738-740.

Duncan, R., et al., "A Q-Enhanced Active-RLC Bandpass Filter," IEEE Transactions on Circuits and Systems-II: Analog and Digital Signal Processing 44(5):341-347, May 1997.

Entesari, K., et al., "A 25-75-MHz RF MEMS Tunable Filter," IEEE Transactions on Microwave Theory and Techniques 55(11):2399-2405, Nov. 2007.

Frey, D.R., "Improved Super-Regenerative Receiver Theory," IEEE Transactions on Circuits and Systems—I: Regular Papers 60(12):3267-3278, Dec. 2013.

Georgescu, B., et al., "Tunable Coupled Inductor Q-Enhancement for Parallel Resonant LC Tanks," IEEE Transactions on Circuits and Systems-II: Analog and Digital Signal Processing 50(10):705-713, Oct. 2003.

Golaszewski, A., and A. Abramowicz, "Voltage Tunable Bandpass Filter," Proceedings of the Signal Processing Symposium (SPSympo), Debe, Poland, Jun. 10-12, 2015, 4 pages.

Guyette, A.C., "Alternative Architectures for Narrowband Varactor-Tuned Bandpass Filters," Proceedings of the European Microwave Conference (EuMC), Rome, Sep. 29-Oct. 1, 2009, pp. 1828-1831.

He, X., and W.B. Kuhn, "A Fully Integrated Q-Enhanced LC Filter With 6 dB Noise Figure at 2.5 GHz in SOI," Proceedings of the

(56) References Cited

OTHER PUBLICATIONS

IEEE Radio Frequency Integrated Circuits (RFIC) Symposium, Fort Worth, Texas, Jun. 6-8, 2004, pp. 643-646.
International Search Report and Written Opinion dated Feb. 8, 2017, issued in corresponding International Application No. PCT/GB2016/053686, filed Nov. 23, 2016, 10 pages.
Kuhn, W.B., et al., "Q-Enhanced LC Bandpass Filters for Integrated Wireless Applications," IEEE Transactions on Microwave Theory and Techniques 46(12):2577-2586, Dec. 1998.
Luo, X., et al., "Tunable Bandpass Filter With Two Adjustable Transmission Poles and Compensable Coupling," IEEE Transactions on Microwave Theory and Techniques 62(9):2003-2013, Sep. 2014.
Nosrati, M., and Z. Atlasbaf, "A New Miniaturized Electronically Tunable Bandpass Filter," Proceedings of the Seventh International Symposium on Antennas, Propagation & EM Theory (ISAPE '06), Guilin, China, Oct. 26-29, 2007, 5 pages.
Piazza, G., "MEMS Resonators for Frequency Control and Sensing Applications," presentation, University of Pennsylvania, Philadelphia [at least as early as Apr. 24, 2015], 104 pages.
Psychogiou, D., et al., "V-Band Bandpass Filter With Continuously Variable Centre Frequency," IET Microwaves, Antennas & Propagation 7(8):701-707, Jun. 2013.
Quednau, P., et al., "A Small Size Low Cost Electronically Tunable Bandpass Filter With Integrated Bias Control," Proceedings of the IEEE International Conference on Microwaves, Communications, Antennas and Electronic Systems (COMCAS), Tel Aviv, Israel, Oct. 21-23, 2013, 4 pages.
Ramadan, A.H., et al., "A Narrowband Frequency-Tunable Antenna for Cognitive Radio Applications," Proceedings of the Sixth European Conference on Antennas and Propagation (EuCAP), Mar. 26-30, 2012, Prague, 5 pages.
Ramadan, A.H., et al., "A Tunable Filtenna for Cognitive Radio Applications," Proceedings of the Ninth European Conference on Antennas and Propagation (EuCAP), Apr. 13-17, 2015, Lisbon, Portugal, 2 pages.
Soorapanth, T., and S.S. Wong, "A 0-dB IL 2140 ± 30 MHz Bandpass Filter Utilizing Q-Enhanced Spiral Inductors in Standard Cmos," IEEE Journal of Solid-State Circuits 37(5):579-586, May 2002.
Sunca, A., et al., "A Wide Tunable Bandpass Filter Design Based on CMOS Active Inductor, " Proceedings of the Eighth Conference on Ph.D. Research in Microelectronics and Electronics (PRIME), Session TF3—Microwave and RF, Aachen, Germany, Jun. 12-15, 2012, pp. 203-206.
Wang, S., and R.-X. Wang, "A Tunable Bandpass Filter Using Q-Enhanced and Semi-Passive Inductors at S-Band In 0.18-μM CMOS," Progress in Electromagnetics Research B 28:55-73, 2011.
Written Opinion of the International Preliminary Examining Authority dated Feb. 5, 2018, issued in corresponding International Application No. PCT/GB2016/053686, filed Nov. 23, 2016, 6 pages.
He, X., and W.B. Kuhn, "A 2.5-GHz Low-Power, High Dynamic Range, Self-Tuned Q-Enhanced LC Filter in SOI," IEEE Journal of Solid-State Circuits, vol. 40, No. 8, Aug. 2005, 1618-1628.
Gao, W. and W.S. Snelgrove, "A 950MHz Second-Order Integrated LC Bandpass Modulator" 1997 Symposium on VLSI Circuits Digest of Technical Papers, pp. 111-112.
Zumbahlen, Hank: "Chapter 5: Analog Filters ; Section 5-6: Filter Realizations" In: "Op Amp Applications Handbook". Dec. 31, 2005, Newnes, Oxford, pp. 5.59-5.100.
Deliyannis, Theodore L, et al.: "5.6 Multiple-Loop Feedback Filters" In: "Continuous-Time Active Filter Design." Jan. 1, 1999, Boca Raton, FL: CRC Press, US 028016, pp. 162-171.

\* cited by examiner

USE OF STABLE TUNABLE ACTIVE FEEDBACK ANALOG FILTERS IN FREQUENCY SYNTHESIS

FIELD

This relates to frequency synthesis for radio frequency (RF) applications, and in particular, to fast frequency switching applications such as frequency hopping communications.

BACKGROUND

The need for arbitrary frequency in radio communications has led to the creation of numerous devices for frequency synthesis. While a number of frequency conversion techniques are currently available in the prior art, the rise of various frequency hopped communication systems has led to the prevalent use of Direct Digital Sequence (DDS).

Conventional DDS is a technique for using digital data processing blocks as a means to generate both a frequency tunable and phase tunable output signal referenced to a fixed-frequency precision reference clock source. In essence, the reference clock frequency is "divided down" in a DDS architecture by the scaling factor set forth in a programmable binary tuning word stored within the Frequency Control Register (FCR). This "dividing down" generally limits the maximum synthesized frequency to the Nyquist frequency limit which is one-half of the reference oscillator clock frequency. A block diagram of a conventional DDS 10 is shown in FIG. 1 and includes digital signal components, such as a frequency-controlled register (FCR) 12, a numerically-controlled oscillator (NCO) 14, a reference oscillator 16, a digital-to-analog converter 18, and a reconstruction lowpass filter 19.

A conventional numerically controlled oscillator (NCO) is a DSP implementation of a generic local oscillator (LO) as required for a desired transceiver frequency conversion and signal correlation. The NCO is driven by the same reference oscillator clock and controlled by the FCR. The tuning word is typically 24-48 bits long, driven in large part by a lookup table (LUT) that has high resolution in terms in phase and amplitude increments, resulting in large read only memory (ROM) requirements. Frequently contained within the NCO is a typically wideband tunable DSP-based filter that removes unwanted spurious output signals. Adding a high-speed digital-to-analog converter (DAC) to the NCO results in an analog sinusoidal RF output suitable for driving analog components. Herein, the term RF is not limited at either low or high frequency. Typically, this analog output is additionally passed through a low pass filter to remove all unwanted high frequency spurious components of the resulting frequency synthesis. The conventional DDS typically relies heavily on digital signal processing. FIG. 2 shows an example of a 7 MHz signal generated by a 100 MHz clock DDS with a large ROM LUT with a 14-bit accumulator, with 4-bits dither, and a 12-bit DAC.

A significant advantage of a DDS output is that it is phase coherent, regardless of the imposed frequency and phase modulation. Also, the transition from one frequency output to another, as well as continuous frequency sweeps, may be time synchronous during the transition. This is of significance in implementation of modern radar and radio communications. The utility of a DDS is that frequency transitions may be instantaneous over a broad frequency interval without losing phase coherency, as is typical of a LO based on a Phase Locked Loop (PLL) based frequency synthesis.

In a communications system, the modulated signal based on a DDS may therefore remain coherent from one transmitted data burst to the next, which may map into higher data throughput. In a frequency agile radar application, the transmitted signal remains coherent over multiple pulses. Therefore, more signal information regarding the target may be abstracted from the return echo signal. For instance, the distance to the target can be inferred from the phase of the return signal as the frequency is changed.

Some disadvantages to the DDS frequency synthesis architecture may include:
  Power: There is a relatively high power requirement for the DSP based signal processing and DSP based NCO. In one example, a device operating at 3.5 GHz may consume up to 4 W, presenting a significant challenge for hand-held communications.
  Output frequency: In principle, the DDS may produce sinusoidal outputs from 0 Hz all the way up to an arbitrary harmonic of the clock frequency. However, the DDS is effectively limited in terms of the upper frequency to half the reference clock frequency due to potentially high time domain response distortion at higher synthesized frequencies. Additionally, the output frequency is limited by the Nyquist frequency at the same one-half of the clock frequency.
  Large memory requirements for control FCR.
  Circuit footprint.
  However, the main disadvantage with a DDS is the number of spurious frequency components that exist around the intended frequency component of the synthesized sinusoidal signal. These interfere with frequency translation, as well as interfering with neighboring frequency bands that may lead to intermodulation distortion.

A pure sinusoidal frequency reference signal, with a frequency spectrum that is not distorted with spurious frequency components in the neighborhood of the desired frequency, is beneficial for high performance signal processing architectures of modern RF communication architectures. While the DDS LUT and DAC must support a high clock rate, such that there are number of DAC readout samples per cycle of RF signal produced by the DDS, future 5G networking requirements are at frequencies well above 20 GHz. Creating this pure synthetic frequency may be challenging using DDS techniques.

SUMMARY

According to an aspect, there is provided a method of generating a signal, the method comprising the steps of: using digital signal components, generating a synthesized signal having a plurality of frequency components; filtering the synthesized signal using an analog filter having a passband, the analog filter comprising a tunable, active feedback circuit having one or more variable resonators and a variable gain block connected in a signal loop; and tuning the analog filter such that the passband of the analog filter overlaps one or more desired frequency components of the plurality of frequency components of the synthesized signal, and such that the passband has a relative bandwidth of about 1% or less.

According to other aspects, the method may further comprise one or more of the following elements, alone or in combination: the synthesized signal may be frequency translated such that the plurality of frequency components comprise a plurality of translated frequency components; the synthesized signal may be filtered before and after the synthesized signal is frequency translated; the one or more desired frequency components may be filtered from among frequency components that may be as close as 0.01% to 0.1% of the one or more desired frequency components; the analog filter may comprise a plurality of analog filters, and the plurality of analog filters may comprise a plurality of distinct passbands; and the method may further comprise the steps of configuring the synthesized signal and tuning the analog filter to one or more different desired frequency components.

According to an aspect, there is provided an apparatus for generating a signal, the apparatus comprising a synthesizer that generates a synthesized signal having a plurality of frequency components; an analog filter connected to process the synthesized signal, the analog filter having a passband that filters the synthesized signal, the analog filter comprising a tunable, active feedback circuit having one or more variable resonators and a variable gain block connected in a signal loop; and a controller connected to the synthesizer and the analog filter. The controller may comprise instructions to tune the analog filter such that the passband of the analog filter overlaps one or more desired frequency components of the plurality of frequency components, the analog filter being capable of generating a relative bandwidth of the passband of about 1% or less.

According to other aspects, the apparatus may further comprise one or more of the following elements, alone or in combination: there may be a frequency translator adapted to translate the synthesized signal such that the plurality of frequency components comprise a plurality of translated frequency components; the analog filter may be connected between the synthesizer and the frequency translator, and may further comprise an additional analog filter connected downstream of the frequency translator; the one or more desired frequency components may be filtered from among frequency components that are within about 0.1% to about 1% of the desired frequency component; the analog filter may comprise a plurality of analog filters; the synthesizer may be adapted to tune the plurality of frequency components, and the controller may further comprise instructions to tune the analog filter to a different desired frequency component.

In other aspects, the features described above may be combined together in any reasonable combination as will be recognized by those skilled in the art.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION

There will now be described a method and device for generating an RF signal. Digital signal components are used to generate a synthesized signal having a plurality of frequency components. The synthesized signal is filtered by an analog filter. The analog filter may be a tunable, active feedback circuit with one or more variable resonators, and a variable gain block connected in a signal loop. The analog filter applies a tunable passband to the synthesized signal to select one or more DDS synthesized frequency components. By narrowing and/or tuning the passband, the method and device allows an analog signal to be generated that has the desirable frequency content. This may be used to generate a close approximation of a desired continuous single-frequency analog signal with a minimal bandwidth, and at a desired frequency. A circuit implemented with such an analog tunable filter (ATF) will be referred to herein as the ATF-DDS. It will be understood that, while the frequency synthesis circuit described herein uses the term DDS, the circuit may use digital signal components other than commonly-known designs of a DDS, and that the circuit may be based on a different circuit design that uses to generate a synthesized signal that may then be suitably filtered to produce the desired output signal.

Figure 1:
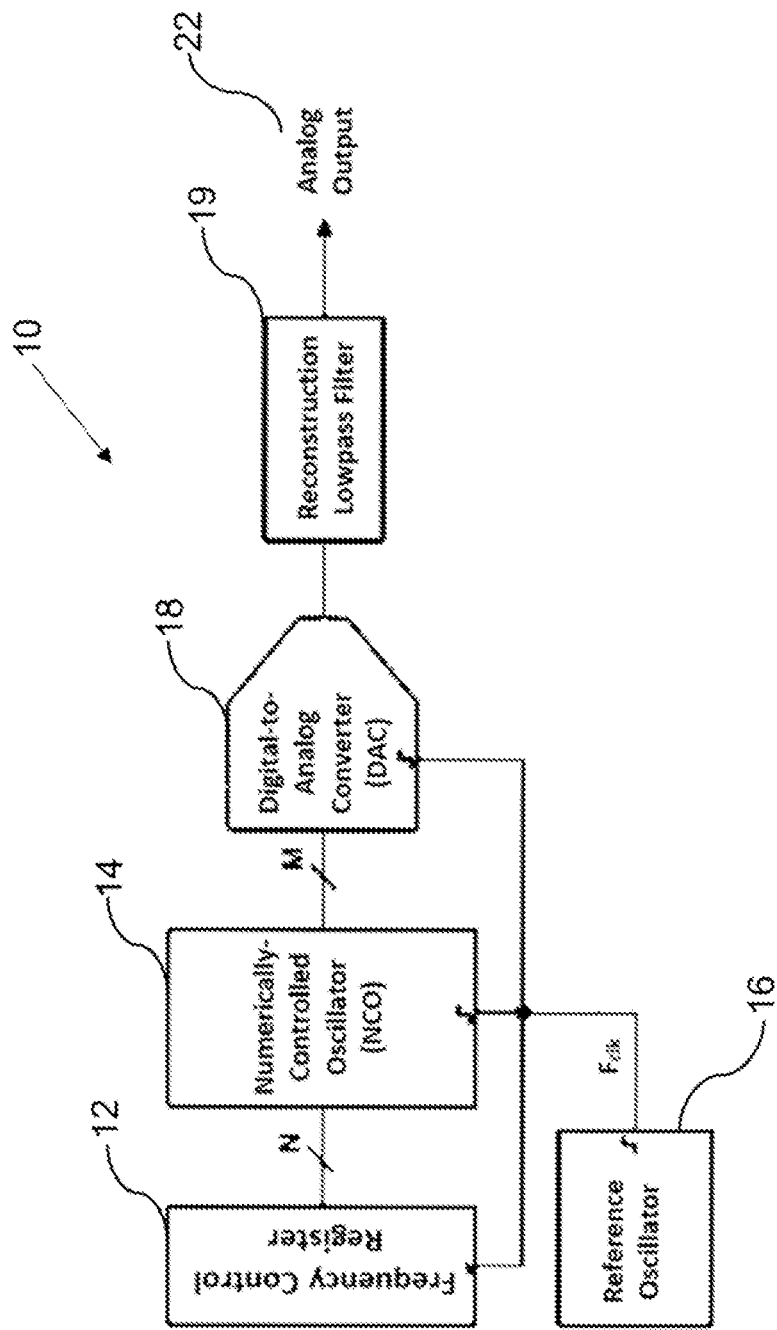
FIG. 1 is a block diagram of a conventional Direct Digital Sequence (DDS) circuit.
Figure 3A:
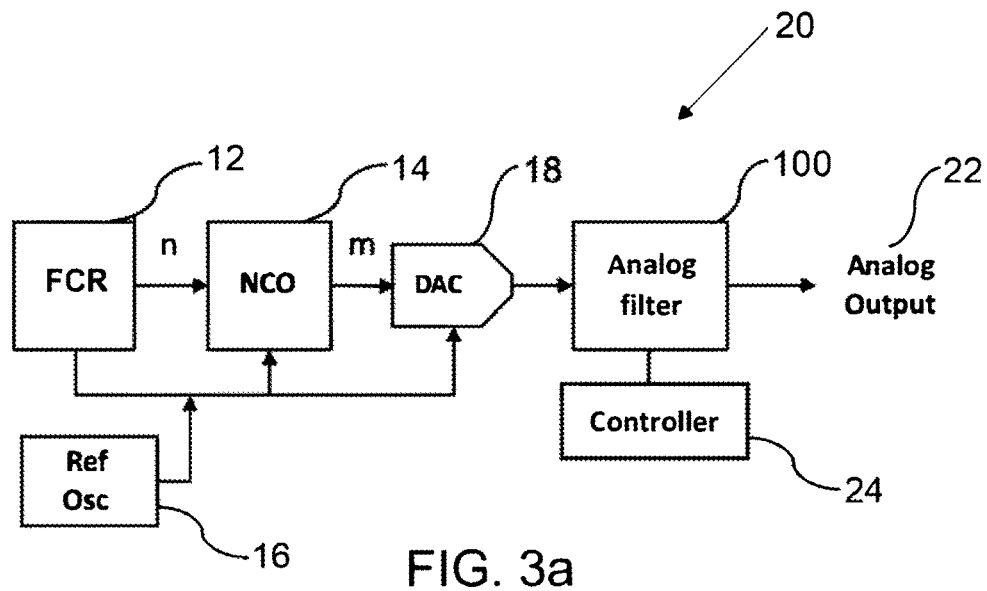
FIG. 3a is a block diagram of an ATF-DDS.

In one example, FIG. 3a shows a block diagram of an ATF-DDS 20 that uses a narrowband, analog, high-performance tunable filter 100 downstream of a DDS 10. In this example, ATF-DDS 20 includes digital signal components similar to those shown in FIG. 1, such as a frequency-controlled register (FCR) 12, a numerically-controlled oscillator (NCO) 14, a reference oscillator 16, and a digital-to-analog converter 18. These components are known in the art, and are connected and operated as is known in the art. The output of these components is input into analog filter 100 to produce the desired analog output 22. A controller 24 is preferably included that controls analog filter 100, such as to tune the passband as described herein. Controller 24 may also be connected to control one or more other circuit components, and may operate based on user input, preprogrammed parameters, or a combination thereof. The specific control techniques of ATF-DDS will not be discussed further. It will be noted that ATF-DDS 20 as depicted in FIG. 3a does not include reconstruction lowpass filter 19 as shown in FIG. 1, but instead includes analog filter 100 to produce the analog output. It will be understood that other filters and other components may be used downstream of DDS 10 if required by a particular intended use.

Active feedback analog filter 100 may be used to provide a narrow passband filter that is tunable, both in terms of center frequency and the width of the passband. This allows for a variable degree of selectivity to be applied to the synthesized signal generated by DDS 10. For example, the passband may be tuned to have a width that it is 1% or less than the relative frequency and may be tuned in frequency to extend across a desired set of frequencies. The passband may also be tuned to have a wider frequency, if desired for some circumstances. In this manner, a user may select one or more frequency components from among the frequency components in the synthesized signal generated by DDS 10. In some examples, the passband may be tuned to select one or more desired frequency components that may be as close as 0.01% to 0.1% of adjacent, undesired frequency components. It will be understood that ATF-DDS 20 may be designed with more complex structures that may, for example, generate more than one passband to select frequency components that are not adjacent on the spectrum, that are separated by undesirable frequency components, or other undesirable features. In addition, by tuning ATF 100, the frequency components in the analog output signal are also changed, which may be useful, for example, in frequency-hopping applications. Other, more complex circuit designs may also be used for various applications.

Some examples of tunable band pass filters that may be used as analog filter 100 are described in U.S. Pat. No. 10,050,604 (Nielsen et al.) entitled "Variable Filter". These filters may be designed to be stable, tunable, active feedback filters used as a narrow bandwidth filter to achieve improved performance and frequency range. Examples of analog ATF filters 100 are shown in FIG. 3b-3d.

Figure 3B:
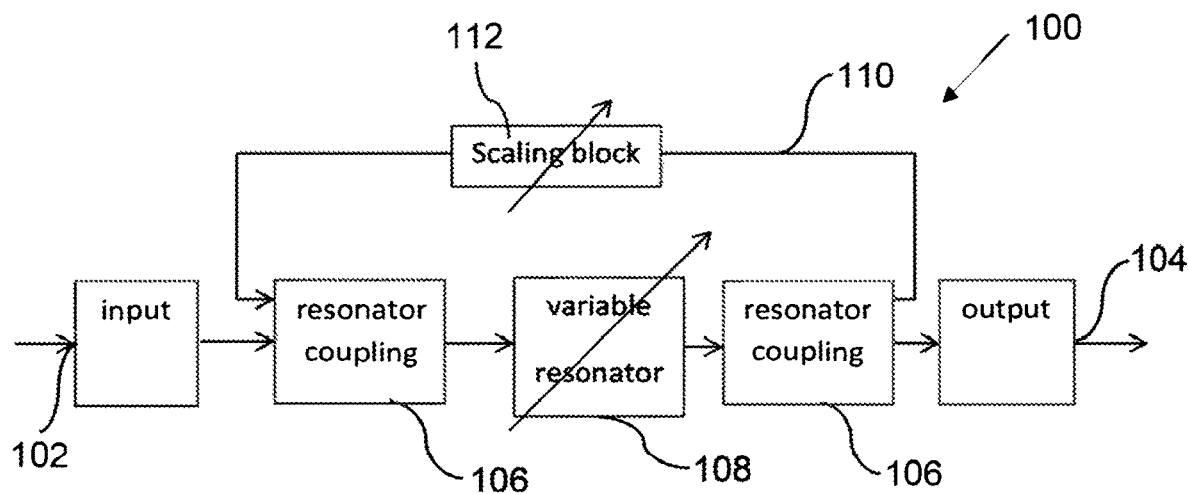
FIG. 3b-d are block diagrams of analog filters with one or more variable resonators within an active feedback loop.
Figure 3C:
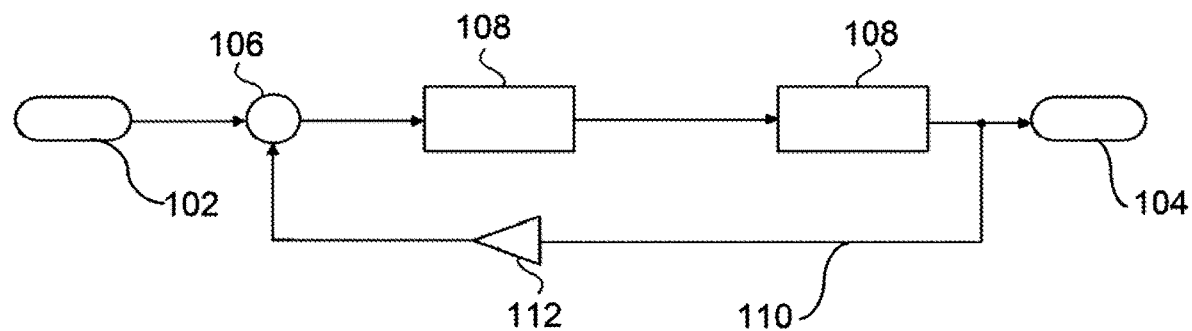
Figure 3D:
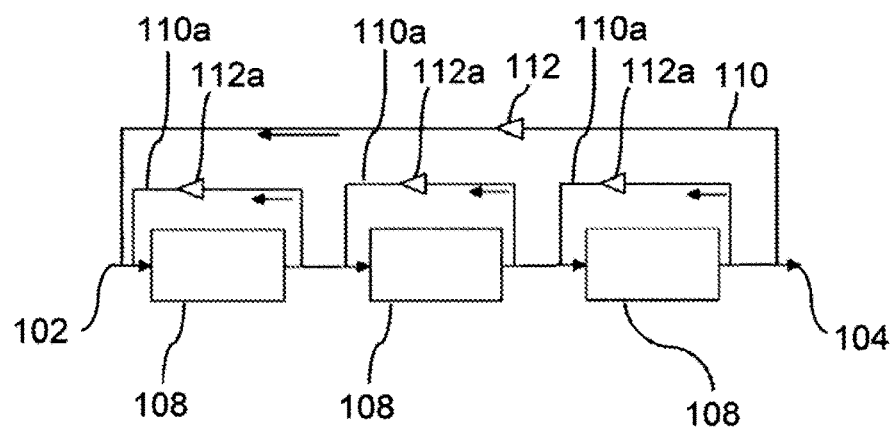

Referring to FIG. 3b, analog tunable filter 100 may include an input 102, an output 104, resonator couplings 106, a variable resonator 108, and a feedback loop 110 with a variable scaling block 112. Referring to FIG. 3c, analog tunable filter 100 includes multiple variable resonators 106 connected in series. Referring to FIG. 3d, analog filter 100 may include variable resonators 106, each of which may have an individual variable feedback loop 110a with a scaling block 112a connected within the overall feedback loop 110. It will be understood that the number of resonators and the overall circuit architecture may vary according to the preferences of the user or the requirements of a given application.

The design described herein may be implemented, for example, by utilizing smaller components that use less power and may be implementable at chip level with no off-chip components relative to other known DDS designs.

Figure 2:
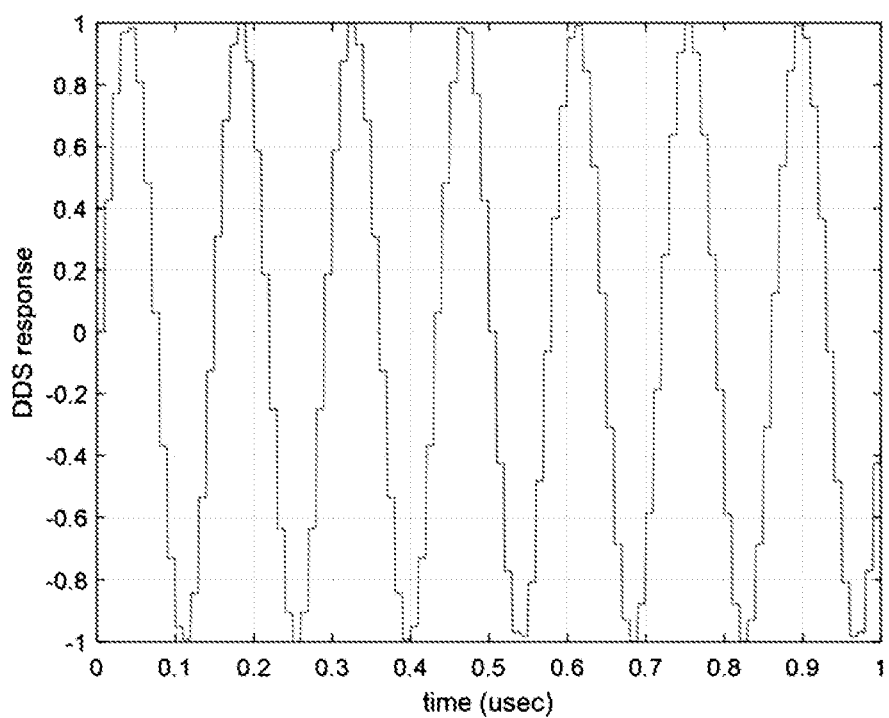
FIG. 2 is a graph depicting a DDS time domain response generating a 7 MHz signal using a 100 MHz clock.
Figure 4:
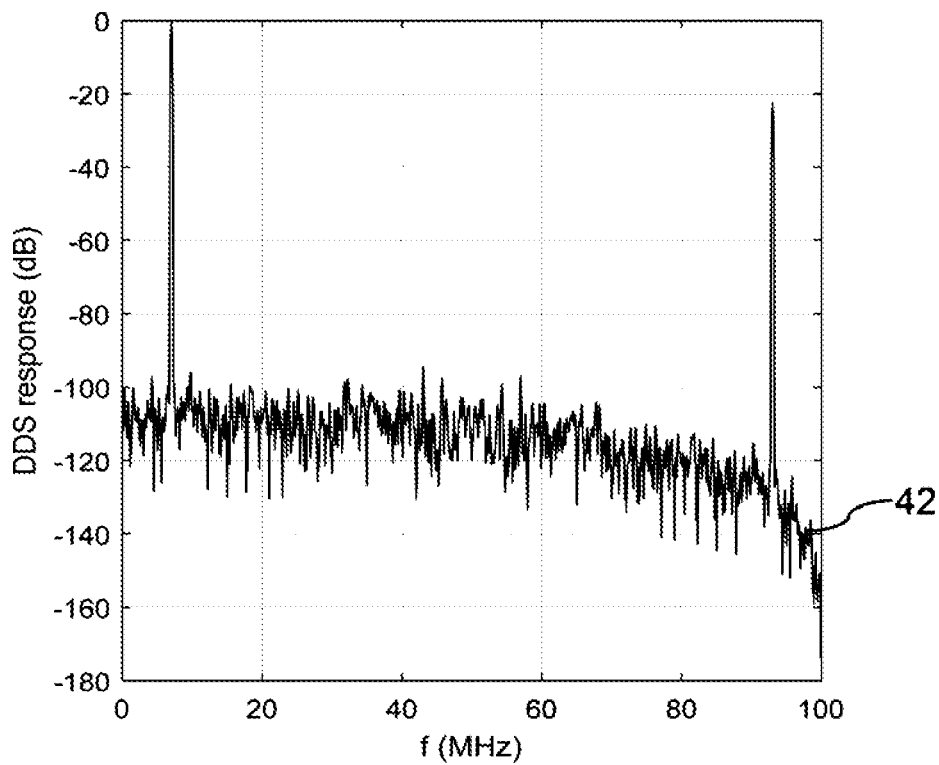
FIG. 4 is a plot of the spectrum of a conventional DDS produced 7 MHz signal with a 100 MHz clock showing one of the high frequency spurious tones at 93 MHz.

The structured frequency domain response of a synthesized 7 MHz DDS signal using a 100 MHz clock, as produced by the prior art discussed above, is shown in FIG. 4 labeled line 42 and showing the line spectral component at 7 MHz. It is the higher order frequency terms at 93 MHz and 107 MHz and so forth, seen in the highly structured signal of FIG. 7, that generate the staircasing distortion in the time domain response of FIG. 2.

Typically, a low pass interpolating filter will be used with a DDS to suppress these higher order frequency terms, leaving the fundamental frequency, which is 7 MHz in this example. The phase noise of this desired fundamental tone may include phase noise from the reference clock signal driving the DDS and the jitter of the digital processing of the DDS.

The DDS with a low pass filter is therefore well behaved for frequency synthesis when the desired fundamental frequency is a fraction of the clock frequency. To generate different frequencies, a DDS output may be translated with a frequency translator. For example, the frequency may be up-converted as is known in the art, such as with a fixed frequency LO signal. The unwanted frequency spurs are generally removed from the DDS output prior to up-conversion using the low pass fixed filter in order to control the proliferation of frequency spurs. With up-conversion, the bandwidth of the DDS will approach that of the clock frequency as both positive and negative frequencies may be generated with a quadrature DDS producing both in-phase and quadrature phase components. However, such single sideband up-conversion typically requires two DDS-DAC outputs for the in-phase and quadrature signal synthesis, as well as a pair of matched frequency mixers. Any mismatch of the mixer pair will result in a frequency spur in the unwanted sideband. Also, as the DDS frequency approaches the Nyquist limit of half the clock frequency, the low pass filter transition requirement becomes excessive. Hence there is a compromise of the frequency spur performance and the afforded fixed low pass filter complexity. Other methods of translating the frequency may also be used with suitable modifications.

A key utility of the DDS is the precision synthesis of a quasi-sinusoidal signal that is time-phase coherent over an arbitrary number of frequency steps. As indicated above, good performance requires a precision high speed DAC and large LUT. Typically, the frequency range is limited to a fraction of the DDS clock frequency for reasons discussed above. Hence, for an application such as a communications transceiver or radar that is based on DDS synthesized frequency hopping, a high performance, high speed DDS is required. This is not typically an issue for large high-valued platforms where power consumption, circuit size and cost are secondary issues, but for smaller low-cost components, a low-cost DDS may not provide sufficient performance. An example of a low-cost DDS might be in specific applications where the LUT is part of the firmware for an FPGA.

Figure 5:
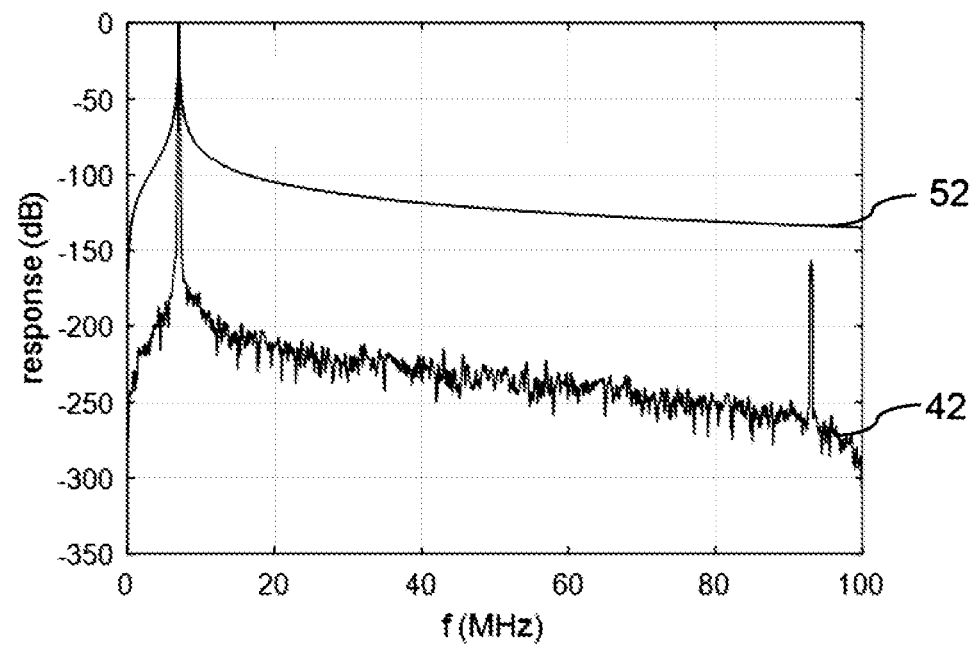
FIG. 5 is a plot of the smooth normalized frequency response of an analog filter centered at the 7 MHz signal of FIG. 4 and structured normalized output spectrum of the ATF-DDS.

Extending the Synthesized Output Signal Frequency Beyond the Synthesizer Clock Frequency The architecture described herein permits frequencies to be achieved beyond the synthesizer clock frequency by coupling digital signal components from a low-complexity DDS, with an active feedback narrowband variable frequency filter, described herein as the ATF-DDS. For simplicity, the digital signal components will be referred to herein as a DDS. In one example, a variable frequency filter may be used to track the desired fundamental frequency component of the DDS output and suppress the unwanted spurious components. This results in a clean output spectrum at a single dominant frequency component as shown in FIG. 5, labeled as line 52, and in FIG. 7, labeled as line 72. The ATF-DDS may be used to provide a low-distortion time domain sinusoidal signal ideal for transmit signal generation as well as signal correlation in the receiver. In other examples, the ATF-DDS may be used to select more than one frequency component, either by filtering for adjacent frequency components, by using an analog filter that has more than one passband, or by using multiple ATF filters.

The ATF-DDS may allow the clock reference frequency to be significantly reduced as the analog filter may be used to select a wide range of frequency components of the DDS output without being subject to the Nyquist frequency limit of the DDS. Hence the produced output frequency range may be extended to several times that of the reference clock frequency instead of being limited to a fraction of the clock frequency as in a DDS that does not use such a variable frequency filter. This may allow the size of the ROM LUT to be reduced as well as the required clock frequency. Furthermore, the variable frequency analog filter may be used to eliminate much of the wide bandwidth quantization noise resulting from the finite precision DAC. Not only does this reduce the precision required of the DAC, but also reduces the size of the ROM LUT as fewer sample bits are required.

FIG. 5 shows an example of a high-performance analog filter applied to the 7 MHz DDS signal described above. The normalized frequency response of the analog variable frequency narrowband analog filter is shown on top, and the resulting ATF-DDS structured spectrum filtered by the analog filter is shown at the bottom. The analog filter used in this example consists of cascaded high performance active analog tunable filters as described in Nielsen et al. In particular, the ATF herein comprises two cascaded variable filter components of the referenced patent, where the number of dominant poles in the filter section may be varied. Additional architectures for the ATF, using additional poles and/or additional tunable filter modules are not excluded.

Figure 6:
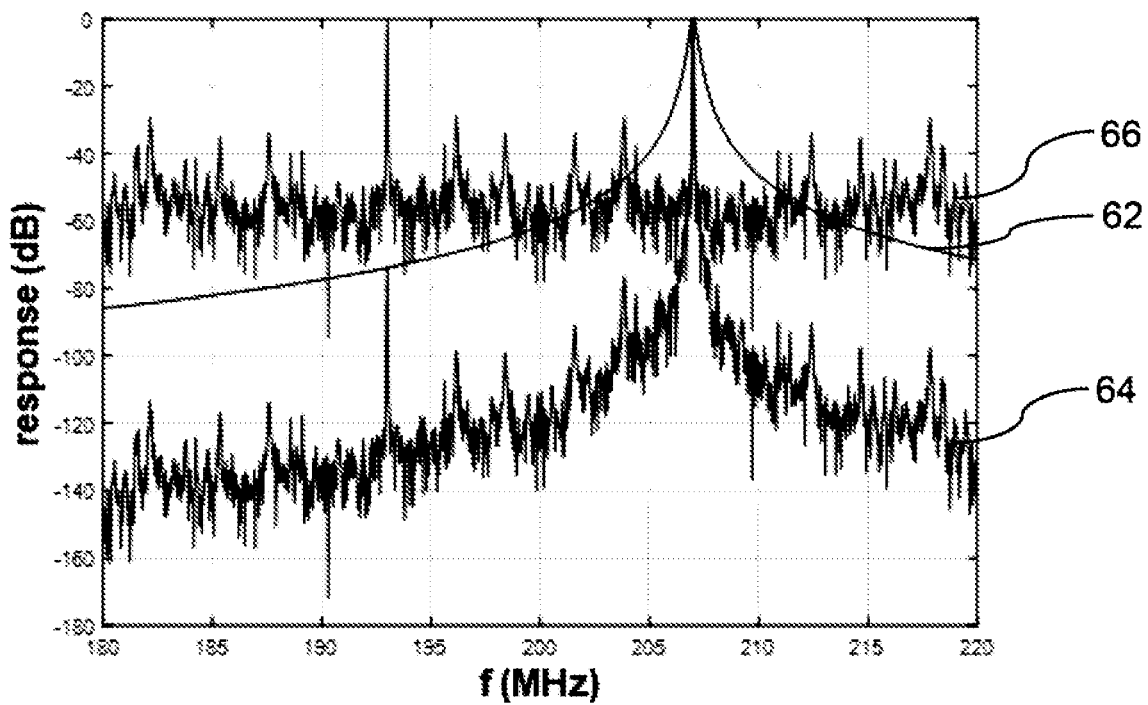
FIG. 6 is a graph depicting the spectrum of a frequency translated DDS output with a fundamental at 7 MHz and clock at 100 MHz, the frequency response of the analog filter, and a normalized output spectrum of the ATF analog filtered DDS signal.

As another example, consider the DDS described above (100 MHz clock and 7 MHz fundamental) that is up-converted by a square wave 200 MHz LO. The portion of the DDS spectrum between 180 MHz and 220 MHz, without the analog filter is shown in FIG. 6 as the structured upper trace, labeled line 66. Note that both the upper sideband modulation spectral component at 207 MHz, as well as the lower sideband spectral component at 193 MHz, are present along with many other spectral components produced by the up-conversion process. As before, the smooth center trace, labeled line 62 is the frequency response of an analog filter. The bottom structured trace, labeled line 64 is the resulting filtered spectrum showing the selection of desired upper sideband at 207 MHz.

As revealed in this simulation, the DDS operating with a 100 MHz clock can synthesize quasi-sinusoidal waveforms over a tuning bandwidth that is several times that of the DDS clock.

Consider the application of a frequency hopping communications system where the frequency increment of the individual hops may extend past the DDS clock frequency. It is necessary to jump between different mixer spectral components. However, all of these spectral components are phase coherent with respect to the original DDS clock. Hence phase coherency is maintained in the frequency hop. This allows for additional modulation information to be packed into the carrier waveform increasing the overall information throughput.

Figure 7:
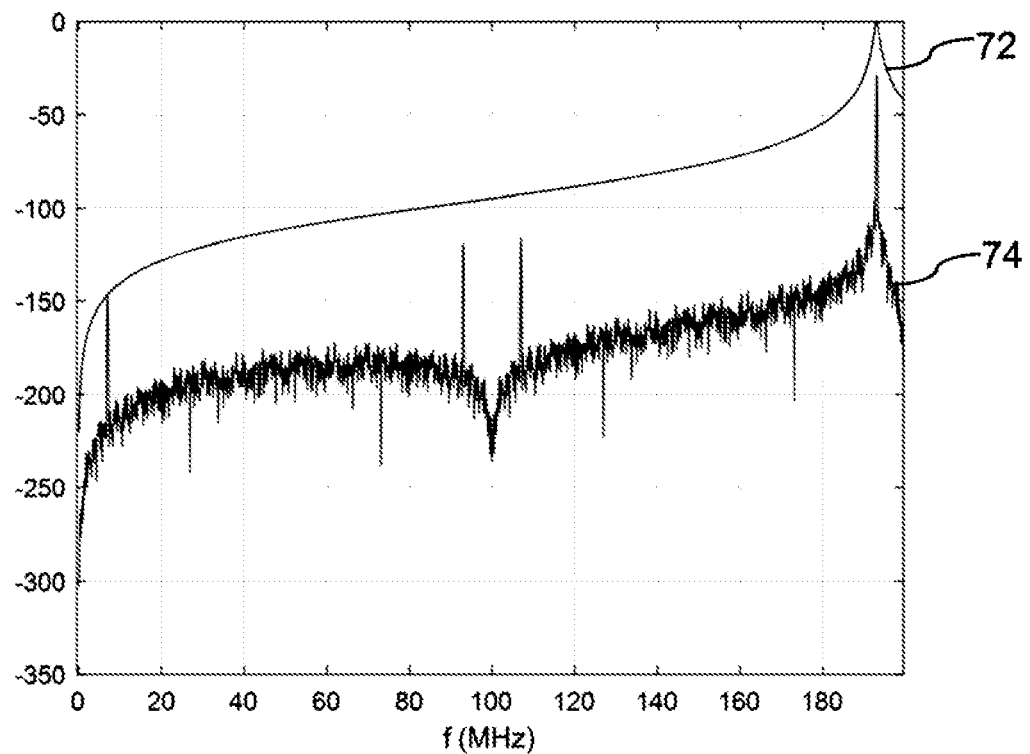
FIG. 7 is a plot of a frequency translated DDS output, the tuned analog passband, and the filtered frequency response centered at 193 MHz.

In another example presented in FIG. 7, the DDS output is not up-converted with an LO. Instead, the higher harmonic content of the DDS output is utilized by appropriately tuning the analog filter. Shown is the plot of the frequency transfer function of the same ATF which is now centered at the frequency of the component at 193 MHz with a Q of 167, labeled as line 72, and the resulting structured output filtered spectrum below, labeled as line 74.

Figure 8:
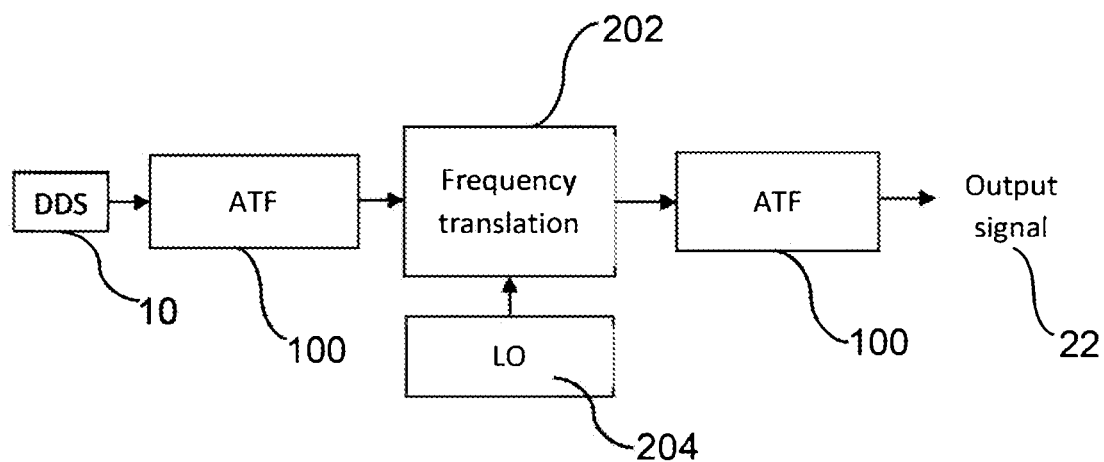
FIG. 8 is a block diagram of the combination of the DDS with ATF filters and frequency translation to generate the desired sinusoidal output carrier signal.

Additional combinations of DDS configurations, analog filters and frequency translations may be considered to achieve a desired result. One example of a design variation is shown in FIG. 8 showing a modest DDS 10 output being filtered with an ATF 100, which is frequency translated to a higher frequency using a frequency translation block 202 connected to a fixed LO 204 and then further filtered at a microwave frequency. An arbitrary frequency may be achieved by appropriately configuring the DDS in combination with a fixed LO 204, or by providing a tunable LO 204. In another example, analog filter 100 may have a multi-pole bandpass response to enable an analog signal with a desired bandwidth. In a further example, analog filter 100 may apply a filter response with a plurality of distinct passbands.

Calibration of the ATF

Figure 9:
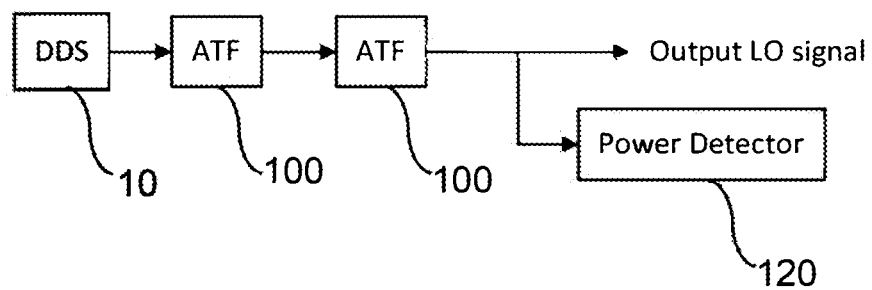
FIG. 9 is a block diagram of the DDS with ATF filters and an added power detector as an element of calibration.

In order to calibrate the ATF-DDS, a power detector may be added, which may be as simple as a diode/DAC that is built in. A method of calibration in the context of the DDS with two ATF filters as shown in FIG. 9 may be as follows:

The DDS may be programmed with a specific clock frequency and fundamental frequency and the resulting frequency spectrum may consist of deterministic frequency components that are accurately known.

The ATF may then be swept in frequency, registering the pattern of frequency components based on the output of the power detector.

The amplitude at a specific frequency may then be maximized with the frequency control.

The DDS frequency may then be changed slightly and the drop in the power detector output is registered.

The detector power output may be used to estimate the bandwidth of the filter.

The ATF loop gain may be set accordingly.

Comparing Performance of a Prior Art DDS with a High-Performance ATF-DDS

While a data sheet for a DSP-DDS may be very detailed, some of the key differences between an example of an existing DDS and the same DDS integrated with a tunable active feedback analog tunable filter (ATF-DDS) are presented in Table 1. It will be understood that the results listed in Table 1 are for illustration purposes only and may vary depending on the particular circuit.

TABLE 1

Parameter performance comparison of State of the Art (SOA) DSP-DDS operating with a clock frequency of 3.5 GHz, providing a 1.5 GHz sinusoidal output versus the ATF-DDS using the same core DDS component.

| Parameter | Prior Art DDS | ATF-DDS |
| --- | --- | --- |
| Maximum undistorted synthesized frequency | Half of clock frequency | >10x clock frequency |
| Filtering Q factor | ≈20 | Stable Q of over 1,000 has been demonstrated |
| Narrow-Band SFDR | −92 dBc @ 1.4 GHz | >−95 dBc at all frequencies outside of bands at clock frequency harmonics ± 0.5% $f_c$ |
| Input power | 2.4 W | 20 mW (nominal) |
| Design footprint | 1.5 $cm^2$ | Die integratable |
| Switching speed | Instantaneous | <10 nsec |

As can be seen, incorporating a tunable active feedback analog filter into a DDS architecture may result in a substantially higher frequency range synthesizer at much lower power, with a substantially smaller footprint and no reduction in linearity and noise rejection relative to a DDS without such an analog filter.

In some examples, a lower-resolution DDS, such as a DDS with a lower clock rate and/or lower bit-resolution DAC, may be used with one or more analog tunable filters (ATF) to synthesize a low distortion sinusoidal signal by using the ATF-enabled selection of resultant multiple output frequency components of the DDS. This may also involve the use of a frequency translation to produce a signal at an arbitrary frequency. The ATF may be automatically tuned to the desired frequency component and bandwidth adjusted as desired, isolating this frequency component from the other unwanted frequency components. This may be a highly flexible method as the ATF passband may be dynamically programmed, depending upon specific application requirements. Other benefits may include the ability to:

Narrow the bandwidth for more suppression of the unwanted frequency components of the ATF-DDS output;

Increase the bandwidth for faster output changes;

For an ATF-DDS with phase and amplitude modulation, adjust the ATF to a commensurate bandwidth;

Allow for an implementation of a self-calibrating, agile LO based frequency synthesis created from a LUT of modest phase and amplitude resolution that may result in improved spectral purity and phase coherence, regardless of any arbitrary frequency hopping modulation that may be applied.

In this patent document, the word "comprising" is used in its non-limiting sense to mean that items following the word are included, but items not specifically mentioned are not excluded. A reference to an element by the indefinite article "a" does not exclude the possibility that more than one of the elements is present, unless the context clearly requires that there be one and only one of the elements.

The scope of the following claims should not be limited by the preferred embodiments set forth in the examples above and in the drawings, but should be given the broadest interpretation consistent with the description as a whole.

The invention claimed is:

1. A method of generating a signal, the method comprising the steps of:
    using digital signal components, generating a synthesized signal having a plurality of frequency components comprising a fundamental frequency component and a plurality of spurious frequency components;
    filtering the synthesized signal using an analog filter having a passband, the analog filter comprising a tunable, active feedback circuit having one or more variable resonators and a variable gain block connected in a signal loop; and
    tuning the analog filter such that the passband of the analog filter overlaps one or more desired frequency components of the plurality of spurious frequency components of the synthesized signal, and such that the passband has a relative bandwidth of about 1% or less.

2. The method of claim 1, further comprising the step of frequency translating the synthesized signal such that the plurality of frequency components comprises a plurality of translated frequency components.

3. The method of claim 2, further comprising the step of filtering the synthesized signal before the synthesized signal is frequency translated, after the synthesized signal is frequency translated, or both before and after the synthesized signal is frequency translated.

4. The method of claim 1, wherein the one or more desired frequency components are filtered from among frequency components that are as close as 0.01% to 0.1% of the one or more desired frequency components.

5. The method of claim 1, wherein the analog filter comprises a plurality of analog filters.

6. The method of claim 5, wherein the plurality of analog filters comprises a plurality of distinct passbands.

7. The method of claim 1, further comprising the steps of configuring the synthesized signal and tuning the analog filter to one or more different desired frequency components.

8. An apparatus for generating a signal, the apparatus comprising:
    a synthesizer that generates a synthesized signal having a plurality of frequency components comprising a fundamental frequency component and a plurality of spurious frequency components;
    an analog filter connected to process the synthesized signal, the analog filter having a passband that filters the synthesized signal, the analog filter comprising a tunable, active feedback circuit having one or more variable resonators and a variable gain block connected in a signal loop; and
    a controller connected to the synthesizer and the analog filter, the controller comprising instructions to:
        tune the analog filter such that the passband of the analog filter overlaps one or more desired frequency components of the plurality of spurious frequency components, the analog filter being capable of generating a relative bandwidth of the passband of about 1% or less.

9. The apparatus of claim 8, further comprising a frequency translator adapted to translate the synthesized signal such that the plurality of frequency components comprises a plurality of translated frequency components.

10. The apparatus of claim 9, wherein the analog filter is connected between the synthesizer and the frequency translator, and further comprises an additional analog filter connected downstream of the frequency translator.

11. The apparatus of claim 8, wherein the one or more desired frequency components are filtered from among frequency components that are as close as about 0.1% to about 1% of the one or more desired frequency components.

12. The apparatus of claim 8, wherein the analog filter comprises a plurality of analog filters.

13. The apparatus of claim 8, wherein the synthesizer is adapted to tune the plurality of frequency components, and the controller further comprises instructions to tune the analog filter to a different one or more desired frequency components.

14. The method of claim 1, wherein tuning the analog filter further comprises adjusting the bandwidth of the passband.

15. The apparatus of claim 8, wherein tuning the analog filter further comprises adjusting the bandwidth of the passband.

* * * * *